United States Patent
Kim

(10) Patent No.: US 10,393,799 B2
(45) Date of Patent: Aug. 27, 2019

(54) ELECTRONIC DEVICE PACKAGE

(71) Applicant: Intel Corporation, Santa Clara, CA (US)

(72) Inventor: Hyoung Il Kim, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/721,850

(22) Filed: Sep. 30, 2017

(65) Prior Publication Data

US 2019/0101583 A1    Apr. 4, 2019

(51) Int. Cl.
| | |
|---|---|
| H01L 23/58 | (2006.01) |
| H01L 29/10 | (2006.01) |
| G01R 31/28 | (2006.01) |
| H01L 21/66 | (2006.01) |
| H01L 23/538 | (2006.01) |
| H05K 1/02 | (2006.01) |
| H01L 23/498 | (2006.01) |

(52) U.S. Cl.
CPC ....... *G01R 31/282* (2013.01); *G01R 31/2889* (2013.01); *H01L 22/14* (2013.01); *H01L 23/49822* (2013.01); *H01L 23/538* (2013.01); *H05K 1/029* (2013.01)

(58) Field of Classification Search
None
See application file for complete search history.

(56) References Cited

U.S. PATENT DOCUMENTS

| | | | |
|---|---|---|---|
| 6,409,521 B1* | 6/2002 | Rathburn | H01R 13/2435 439/66 |
| 7,511,299 B1* | 3/2009 | Alexander | H01L 22/32 257/48 |
| 2009/0212407 A1* | 8/2009 | Foster | B81B 7/0006 257/686 |

* cited by examiner

*Primary Examiner* — Calvin Y Choi
(74) *Attorney, Agent, or Firm* — Thorpe North & Western, LLP; David W. Osborne

(57) ABSTRACT

Electronic device package technology is disclosed. An electronic device package in accordance with the present disclosure can include a substrate. The electronic device package can also include an electronic component disposed on the substrate and electrically coupled to the substrate. The electronic device package can further include a connector disposed on the substrate and electrically coupled to the substrate for communication with the electronic component. The connector can have a contact to interface with a mating connector and configured to provide a signal and/or power to the electronic component to facilitate testing the electronic component. Additionally, the electronic component can include an encapsulant material disposed on the substrate and at least partially encapsulating the electronic component and/or the connector. The contact can be accessible on a top side of the electronic device package to facilitate coupling the connector to a testing device. Associated systems and methods are also disclosed.

21 Claims, 5 Drawing Sheets

ELECTRONIC DEVICE PACKAGE

TECHNICAL FIELD

Embodiments described herein relate generally to electronic device packages, and more particularly to facilitating testing of components in electronic device packages.

BACKGROUND

Current system-in-package (SIP) technology often utilizes many electronic components (e.g., stacked memory dies) that are typically encapsulated in mold compound. During assembly, it is desirable to perform a series of tests on the electronic components to ensure that they function properly (e.g., no faulty electrical connections) to improve assembly yield and avoid subsequently mounting an expensive component (e.g., a controller) on a defective unit. Testing equipment typically utilizes an interposer or test socket board as an adapter for electrically coupling with a subject SIP.

BRIEF DESCRIPTION OF THE DRAWINGS

Technology features and advantages will be apparent from the detailed description which follows, taken in conjunction with the accompanying drawings, which together illustrate, by way of example, various technology embodiments; and, wherein.

Figure 1:
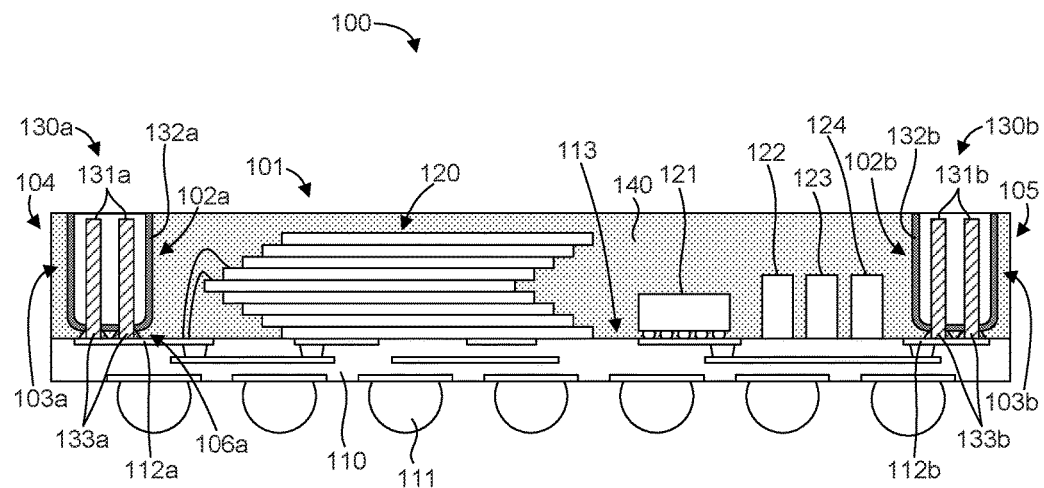
FIG. 1 illustrates a schematic cross-section of an electronic device package in accordance with an example embodiment.

Reference will now be made to the exemplary embodiments illustrated, and specific language will be used herein to describe the same. It will nevertheless be understood that no limitation of the scope or to specific invention embodiments is thereby intended.

DESCRIPTION OF EMBODIMENTS

Before technology embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this written description, the singular forms "a," "an" and "the" provide express support for plural referents unless the context clearly dictates otherwise. Thus, for example, reference to "a layer" includes a plurality of such layers.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in the written description like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The term "coupled," as used herein, is defined as directly or indirectly connected in an electrical or nonelectrical manner. "Directly coupled" items or objects are in physical contact and attached to one another. Objects described herein as being "adjacent to" each other may be in physical contact with each other, in close proximity to each other, or in the same general region or area as each other, as appropriate for the context in which the phrase is used.

Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

EXAMPLE EMBODIMENTS

An initial overview of technology embodiments is provided below and specific technology embodiments are then described in further detail. This initial summary is intended to aid readers in understanding the technology more quickly but is not intended to identify key or essential features of the technology nor is it intended to limit the scope of the claimed subject matter.

Although current testing solutions are generally adequate, there are some shortcomings. An adapter (e.g., an interposer or test socket board) that interfaces with a subject package for adapting a testing device to the subject package may include circuitry that can cause performance and/or signal modification issues, which can lead to uncertainty of the test results. In addition, excessive loading during socketing can easily damage subject packages, while an insufficient load applied during socketing can result in an inadequate electrical coupling. Test adapters can also become damaged (e.g., wear, cracking, etc.) through repeated use. Moreover, most test interface points are located on bottom sides of package substrates and on lateral sides of interposer or test socket board adapters, which can make access for testing difficult.

Accordingly, an electronic device package is disclosed that includes a test interface integrated within the package, which can eliminate the need for a test adapter (e.g., an interposer or test socket board) and therefore avoid its associated drawbacks. In one aspect, the test interface can be accessible through a top side of the package. In one example, an electronic device package in accordance with the present disclosure can comprise a substrate. The electronic device package can also comprise an electronic component disposed on the substrate and electrically coupled to the substrate. The electronic device package can further comprise a connector disposed on the substrate and electrically coupled to the substrate for communication with the electronic component. The connector can have a contact to interface with a mating connector and configured to provide a signal and/or power to the electronic component to facilitate testing the electronic component. Additionally, the electronic component can comprise an encapsulant material disposed on the substrate and at least partially encapsulating the electronic component and/or the connector. The contact can be accessible on a top side of the electronic device package to facilitate coupling the connector to a testing device. Associated systems and methods are also disclosed.

Referring to FIG. 1, an exemplary electronic device package 100 is schematically illustrated in cross-section. The electronic device package 100 can include a substrate 110. The electronic device package 100 can also include one or more electronic components disposed on and electrically coupled to the substrate 110. Electronic components are identified at 120-124.

An electronic component can be any electronic device or component that may be included in an electronic device package, such as a semiconductor device (e.g., a die, a chip, a processor, computer memory, a platform controller hub, etc.). In one embodiment, some of the electronic components may represent a discrete chip, which may include an integrated circuit. The electronic components may be, include, or be a part of a processor (e.g., a CPU, a GPU, etc.), a computer memory device (e.g., ROM, SRAM, DRAM, flash memory, EEPROM, etc.), an application specific integrated circuit (ASIC), a platform controller hub (PCH), a field programmable gate array (FPGA), a modem, a system on a chip (SOC), a system in a package (SIP), or a package on a package (POP) in some embodiments. An electronic component can be any passive electronic device or component, such as a capacitor, resistor, etc. It should be recognized that any suitable number of electronic components can be included.

The substrate 110 may be of any suitable construction or material. For example, the substrate 110 may include typical substrate materials. In some embodiments, the substrate 110 may be configured as an epoxy-based laminate substrate having a core and/or build-up layers. The substrate 110 may be configured as other suitable types of substrates in other embodiments. For example, the substrate can be formed primarily of any suitable semiconductor material (e.g., a silicon, gallium, indium, germanium, or variations or combinations thereof, among other substrates), one or more insulating layers, such as glass-reinforced epoxy, such as FR-4, polytetrafluoroethylene (Teflon), cotton-paper reinforced epoxy (CEM-3), phenolic-glass (G3), paper-phenolic (FR-1 or FR-2), polyester-glass (CEM-5), ABF (Ajinomoto Build-up Film), any other dielectric material, such as glass, or any combination thereof, a ground layer, signal or conductive layer (e.g. copper film) and solder resist, such as can be used in printed circuit boards (PCBs). In some embodiments, the substrate 110 can be constructed primarily of silicon and/or may be configured as an interposer or a redistribution layer (RDL).

The electronic components can be electrically coupled to the substrate 110 according to a variety of suitable configurations including a flip-chip configuration, wire bonding, and the like. One or more of the electronic components can be electrically coupled to the substrate 110 using interconnect structures (e.g., solder balls or bumps and/or wire bonds) configured to route electrical signals between the electronic components and the substrate 110. In some embodiments, the interconnect structures may be configured to route electrical signals such as, for example, I/O signals and/or power or ground signals associated with the operation of the electronic components. In one aspect, the electronic components 120a-h can be in a stacked relationship, for example, to save space and enable smaller form factors. It should be recognized that any suitable number of electronic components can be included in a stack. At least some of the stacked electronic components can be wirebond based integrated circuits (e.g., ASIC, DRAM, and NAND). Such wirebond based integrated circuits can be electrically coupled to one another by wirebond connections.

The substrate 110 may include electrically conductive elements or electrical routing features configured to route electrical signals to or from the electronic components. The electrical routing features may be internal (e.g., disposed at least partially within a thickness of the substrate 110) and/or external to the substrate 110. For example, in some embodiments, the substrate 110 may include electrical routing features such as pads, vias, and/or traces configured to receive the interconnect structures and route electrical signals to or from the electronic components. The pads, vias, and traces can be constructed of the same or similar electrically conductive materials, or of different electrically conductive materials. Any suitable electrically conductive material can be utilized, such as copper, gold, etc. In some embodiments, the substrate 110 can include a solder resist material or other surface treatment forming an outer layer of the substrate. The electronic device package 100 can also include interconnect structures 111, such as solder balls, coupled to a bottom side of the substrate 110 to facilitate electrically coupling the electronic device package 100 with an external electronic component, such as a next level component (e.g., a substrate or circuit board such as a motherboard) for power and/or signaling.

In addition, the electronic device package 100 can include one or more connectors 130a, 130b disposed on the substrate and electrically coupled to the substrate for communication with one or more of the electronic components. The connectors 130a, 130b can have respective contacts 131a and 131b to interface with mating connectors (not shown), which can be coupled to a testing device to test various electrical and/or performance aspects of the electronic device package 100. Thus, for example, the contacts 131a and 131b can be configured to provide signals and/or power to one or more of the electronic components 120-124 to facilitate testing the electronic components when operably coupled to a testing device. The inclusion and integration of the connectors 130a, 130b in the package 100 can provide direct coupling to a testing device without the need for an adapter, such as an interposer or test socket board. In other words, the connectors 130a, 130b can serve as "test sockets" that are integrated into the package 100. This configuration can enable the package 100 to be tested "stand alone" prior to assembly with another component or after assembly on a system board. Thus, component level testing and on-mount system level debugging is possible with the technology disclosed herein, for example, during development or system testing of production parts (e.g., by a customer). In addition, due to the absence of a testing adapter, which may include its own circuitry, a testing device will measure only the performance of the test subject with no uncertainty created by the presence of the testing adapter.

The electronic device package 100 can further include an encapsulant material 140. The encapsulant material 140 can be disposed on the substrate 110 and at least partially encapsulating one or more of the electronic components 120-124 and/or one or more of the connectors 130a, 130b. The contacts 131a and 131b can be accessible on a top side 101 of the electronic device package 100 to facilitate coupling the connectors 130a, 130b to a testing device. This top or vertical exposure to the test interface provided by the contacts 131a, 131b of the respective connectors 130a, 130b can provide easy access for connecting with a testing device. The encapsulant material 140 can comprise any suitable material, such as a mold compound material (e.g., an epoxy).

A connector can have any suitable configuration. For example, the connectors 130a, 130b can have respective housings 132a, 132b. The housing 132a can be disposed about at least a lateral side 102a of the contacts 131a, and the housing 132b can be disposed about at least a lateral side 102b of the contacts 131b. The lateral side 102a of the contacts 131a can be an inner side that is opposite or adjacent to an outer lateral side 103a of the contacts 131a, which is oriented toward an outer lateral side 104 of the electronic device package 100. Similarly, the lateral side 102b of the contacts 131b can be an inner side that is opposite or adjacent to an outer lateral side 103b of the contacts 131b, which is oriented toward an outer lateral side 105 of the electronic device package 100. In some embodiments, the housing 132a can be disposed about all lateral sides (e.g., the inner lateral side 102a and the outer lateral side 103a) of the contacts 131a, and/or the housing 132b can be disposed about all lateral sides (e.g., the inner lateral side 102b and the outer lateral side 103b) of the contacts 131b. In one aspect, the housings 132a, 132b can include any suitable mechanical coupling or securing feature, such as threads, a bayonet style coupling feature, a detent, etc. for securely coupling to a mating connector. The housings 132a, 132b can be constructed of any suitable material, such as a polymer and/or a metal. In one aspect, the material forming the housings 132a, 132b and the encapsulant material 140 can be the same or different materials, which may differ from the substrate 110 material.

The connectors 130a, 130b can be mounted to the substrate 110 in any suitable manner. For example, the connectors 130a, 130b can be surface mounted to the substrate 110 as shown in FIG. 1, such as by having electrical couplings between the contacts 131a and one or more pads 112a of the substrate 110 and/or between the contacts 131b and one or more pads 112b of the substrate 110. For example, leads 133a, 133b can extend from or otherwise be electrically coupled to the respective contacts 131a, 131b. The leads 133a, 133b can be configured to contact the one or more pads 112a, 112b of the substrate 110 and be electrically coupled to the pads by soldering. In one embodiment, shown in FIG. 2, connectors 230a, 230b of an electronic device package 200 can be through-hole mounted to a substrate 210. In this case, for example, the connector 230a can include leads 233a configured as pins that extend from or are otherwise electrically coupled to contacts 231a of the connector 230a. The leads 233a can be configured to extend at least partially into one or more vias 212a of the substrate 210 and be electrically coupled to the vias by soldering.

Figure 2:
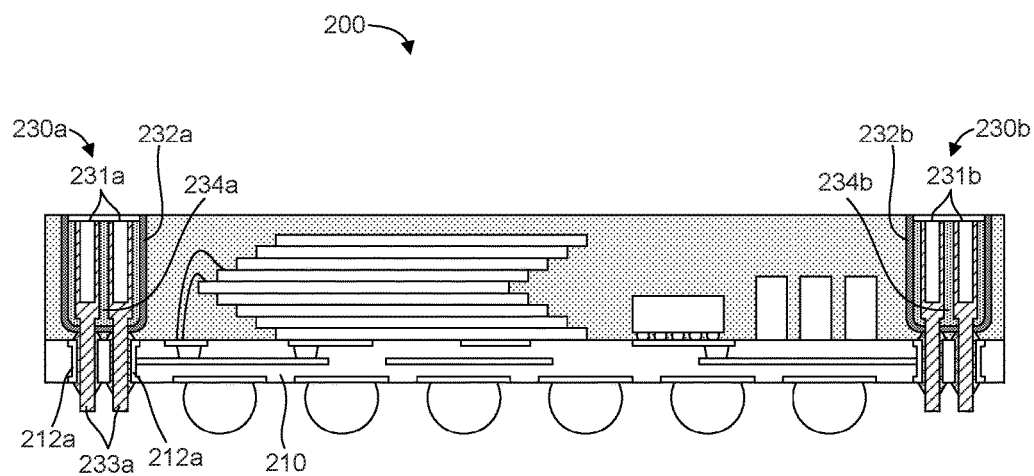
FIG. 2 illustrates a schematic cross-section of an electronic device package in accordance with an example embodiment.

In one aspect, a contact of a connector can have any suitable configuration. For example, the contacts 131a and 131b of FIG. 1 are configured as protrusions, such as pins, which can engage with receptacles and/or contact pads of a mating connector. In another example, the contacts 231a and 231b of FIG. 2 are configured as receptacles, which can engage with protrusions (e.g., pins) of a mating connector. A potting material 234a, 234b (e.g., an epoxy) or other suitable structure may be disposed within respective housings 232a, 232b of the connectors 230a, 230b to provide support for the contacts. In other embodiments, contacts of a connector can be configured as contact pads, which can engage with protrusions (e.g., pins) of a mating connector. In addition, contacts may be fixed or movable (e.g., configured as "pogo pins), relative to the surrounding housing. A contact can be formed of any suitable conductive material, such as a metal (e.g., copper, gold, steel, etc.) It should be recognized that a single connector can have any suitable number of contacts, which may include more than one connector type or configuration, such as a protrusion, a receptacle, a pad, and/or any other suitable type of electrical contact for testing purposes. An electronic device package can also include any suitable number of connectors, which may include multiple connectors that can be the same or different from one another.

In one aspect, a connector can be in any suitable location of the electronic device package. In general, a connector can be located wherever there is available space (e.g. "real estate") on the substrate 110 and that will allow coupling with an external connector. For example, the connectors 130a, 130b can be located on a top side 113 of the substrate 110 and positioned laterally relative to one or more of the electronic components 120-124, which may also be located on the top side 113 of the substrate 110. In some embodiments, as shown in FIG. 1, the connectors 130a, 130b can be proximate the respective lateral sides 104, 105 of the electronic device package 100 and thus be located "outside of" or "outboard to" the electronic components 120-124 (e.g. between the electronic components and an outer lateral side 104, 105 of the device package).

In one aspect, the encapsulant material 140 can be utilized to provide mechanical reinforcement to the connectors 130a, 130b, such as by contacting one or more sides of a connector housing. For example, the encapsulant material 140 can be disposed in contact with the housing 132a of the connector 130a on one or more lateral sides 102a, 103a. In some embodiments, the encapsulant material 140 can be disposed in contact with the housing 132a of the connector 130a on all lateral sides. In this case, the encapsulant material 140 can be continuous between one or more of the electronic components 120-124 and the connector 130a. In some embodiments, the encapsulant material 140 can be disposed in contact with the housing 132a on a bottom side 106a of the housing 132a. In this case, for example, the encapsulant material 140 can be disposed between a portion of the housing 132a and the substrate 110. In other words, the housing 132a can be raised up or elevated above the top side 113 of the substrate 110 so that the encapsulant material 140 can be underneath the housing 132a to provide a better bond with the housing 132a and support the connector 130a during use. Thus, the encapsulant material 140 can surround or partially surround the sides and bottom of the housings 132a, 132b. In one aspect, the housings 132a, 132b can form "sockets" in the encapsulant material 140 and the contacts 131a, 131b can be disposed at least partially in the respective sockets.

Figure 3A:
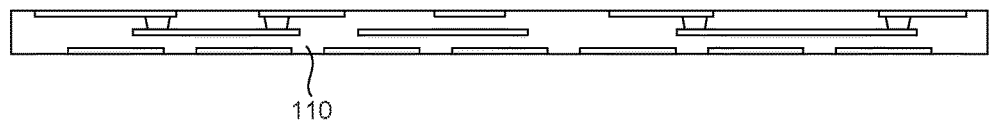
FIGS. 3A-3E illustrate aspects of a method for making an electronic device package in accordance with an example embodiment.

FIGS. 3A-3E schematically illustrate aspects of exemplary methods or processes for making an electronic device package, such as the electronic device package 100. FIG. 3A illustrates a side cross-sectional view of the substrate 110, which may be obtained as an initial step in the process. As described above, the substrate 110 can have any suitable configuration, such as including electrical routing features (e.g., pads, vias, and/or traces), and can be constructed of any suitable material.

Figure 3B:
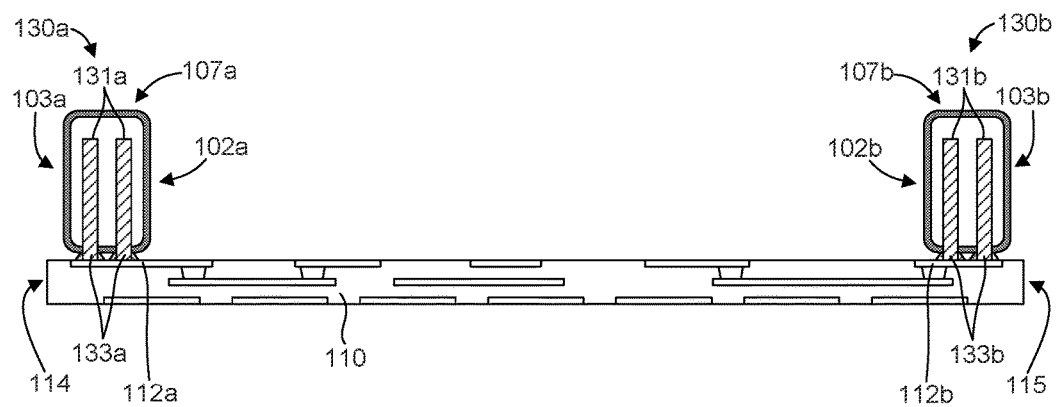

As shown in FIG. 3B, the connectors 130a, 130b can be disposed on the substrate 110 such that the connectors 130a, 130b are electrically coupled to the substrate 110, such as by electrically coupling the leads 133a of the contacts 131a and the leads 133b of the contacts 131b to electrical routing features (e.g., pads 112a, 112b, vias, etc.) of the substrate 110. The connectors 130a, 130b can be disposed on the substrate 110 utilizing any suitable process or technique, such as surface mounting (shown in FIG. 3B e.g., utilizing a reflow process with solder paste), through-hole mounting (applicable for the embodiment shown in FIG. 2 e.g., utilizing wave soldering), etc. The connectors 130a, 130b can be disposed in any suitable location about the substrate 110, such as proximate respective lateral sides 114, 115 of the substrate 110. In one aspect, the housings 132a, 132b can be disposed about one or more lateral sides 102a, 103a and 102b, 103b of the respective contacts 131a, 131b, which can facilitate formation of a socket or recess for the contacts in the later applied encapsulant material. In some embodiments, the housings 132a, 132b can be disposed about top sides 107a, 107b of the respective contacts 131a, 131b. The housings 132a, 132b can therefore form an enclosure about the contacts 131a, 131b that renders the contacts inaccessible to protect and shield the contacts during encapsulation. The portion of the housings covering the top sides 107a, 107b of the contacts 131a, 131b can be removed following encapsulation to expose the contacts, as described below.

Figure 3C:
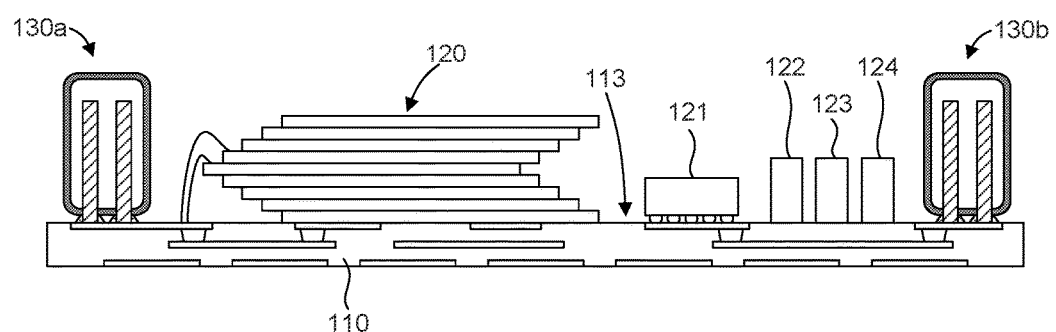

As shown in FIG. 3C, various electronic components 120-124 (e.g., ASIC and/or passive components) can also be disposed on the substrate 110 such that the electronic components 120-124 are electrically coupled to the substrate 110. The electronic components 120-124 can be disposed on the substrate 110 utilizing any suitable process or technique, such as a die attach process, a film cure process, wire bonding, solder bumping, etc. Optionally, one or more of the electronic components 120-124 can be electrically coupled to one or more of the connectors 130a, 130b, such as to provide a signal and/or power to the electronic components to facilitate testing the electronic components. The electronic components 120-124 can be disposed or arranged in any suitable configuration about the substrate 110. For example, the electronic components 120 can be in a stacked arrangement. In some embodiments, any of the stacked electronic components 120 can be electrically coupled to another of the stacked electronic components by a flip chip and/or a wire bond connection. In addition, any of the stacked electronic components 120 can be electrically coupled to the substrate 110 by a flip chip and/or a wire bond connection. The connectors 130a, 130b and the electronic components 120-124 can be disposed about the top side 113 of the substrate 110 in any suitable location or arrangement relative to one another. For example, the various components can be arranged such that the connectors 130a, 130b are positioned laterally relative to one or more of the electronic components 120-124. Although the connectors 130a, 130b have been shown as being disposed on the substrate 110 prior to the electronic components 120-124, it should be recognized that the electronic components 120-124 can be disposed on the substrate 110 prior to or at the same time as the connectors 130a, 130b.

Figure 3D:
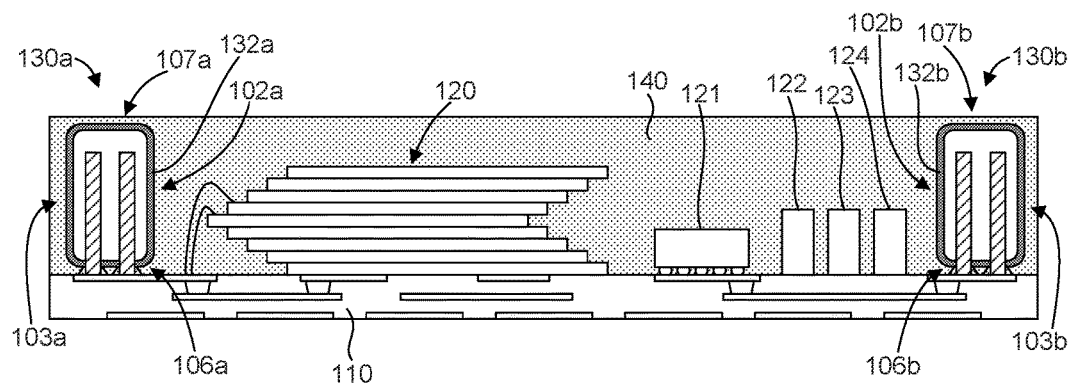

With the electronic components 120-124 and the connectors 130a, 130b coupled to the substrate 110, the electronic components 120-124 and/or the connectors 130a, 130b can be at least partially encapsulated. The electronic components 120-124 and the connectors 130a, 130b can be encapsulated by any suitable process or technique, such as a molding process. In one aspect, the encapsulant material 140 can be disposed on the substrate 110 and adjacent the housings 132a, 132b about any or all of the lateral sides 102a, 103a, the lateral sides 102b, 103b, and the bottom sides 106a, 106b of the respective connectors 130a, 130b, as shown in FIG. 3D. Although not required, the encapsulant material 140 can be disposed adjacent the housings 132a, 132b about the top sides 107a, 107b of the respective connectors 130a, 130b. In this case, the respective housings 132a, 132b can be surrounded on at least one of the lateral sides 102a, 103a and 102b, 103b, and the top sides 107a, 107b by the encapsulant material 140. In one aspect, the encapsulant material 140 can be disposed adjacent the housings 132a, 132b on the bottom sides 106a, 106b of the housings 132a, 132b, such that the encapsulant material 140 is between a portion of the respective housings 132a, 132b and the substrate 110. Thus, in some embodiments, the connectors 130a, 130b can be embedded and substantially covered by the encapsulant material 140. As mentioned above, the portions of the housing on top or covering the top sides 107a, 107b of the contacts 131a, 131b can protect or shield the contacts from contamination by the encapsulant material 140 during encapsulation.

Figure 3E:
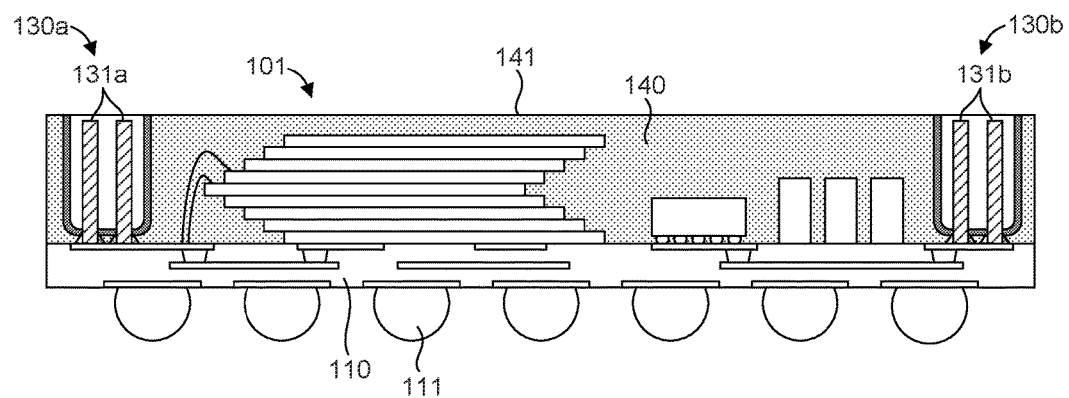

Following encapsulation, as shown in FIG. 3E, the contacts 131a, 131b can be exposed such that the contacts are accessible on the top side 101 of the electronic device package 100 to facilitate coupling the connectors 130a, 130b to a testing device. Portions of the housings 132a, 132b and, in some embodiments, a portion of the encapsulant material 140 can be removed to reveal the contacts 131a, 131b. For example, top portions of the housings 132a, 132b (i.e., over the connectors 130a, 130b) can be removed to expose the contacts 131a, 131b. In one aspect, portions of the housings 132a, 132b can also be removed from one or more lateral sides 102a, 103a and 102b, 103b to expose the contacts 131a, 131b. The remainder of the housings 132a, 132b can establish a "socket" or space in the encapsulant material 140 for coupling the contacts 131a, 131b, which are disposed at least partially within the sockets, with mating connectors for connection with a testing device. In some embodiments, a portion of the encapsulant material 140 can be removed from the top sides 107a, 107b and/or one more lateral sides 102a, 103a and 102b, 103b of the contacts 131a, 131b to expose the contacts and make them accessible for coupling the connectors 130a, 130b to a testing device.

A portion of the housing and/or the encapsulant material can be removed by any suitable material removal process or technique. For example, a portion of the housing and/or encapsulant material can be removed by grinding, polishing, cutting, and/or machining. In some embodiments, portions of the housing and the encapsulant material can be removed simultaneously using the same process. In some embodiments, the tops of the housings 132a, 132b and the top surface 141 of the encapsulant material 140 can be in the same plane, which can result from a planar material removal process. In one aspect, at least the housings can extend above the top of the highest electronic component or interconnect feature so that the top portion of the housing can be removed to expose the contacts without interfering with the proper encapsulation of the electronic components and interconnect features. In some embodiments, substantially only the top portions of the housings 132a, 132b and, optionally, only encapsulant material proximate the housings 132a, 132b may be removed, leaving other portions of the encapsulant material 140 intact.

As further shown in FIG. 3E, interconnect structures (e.g., such as solder balls 111) can be disposed on or coupled to a bottom side of the substrate 110 to facilitate electrically coupling with an external electronic component in order to arrive at the completed electronic device package 100.

The process shown and described in FIGS. 3A-3E is presented in the context of a typical substrate serving as a base with components added or built-up on the substrate. In some embodiments, the substrate 110 can be configured as a redistribution layer. In this case, the redistribution layer can be "printed" or formed on the bottom of the electronic components 120-124, the connectors 103a, 130b, and, optionally, the encapsulant material 140. Thus, in this embodiment, the substrate redistribution layer can be added at a later step in the process. In addition, although the process is shown and described in the context of making a single electronic device package unit, it should be recognized that the process can be utilized to make multiple electronic device package units simultaneously, such as at a panel or wafer processing level.

In one aspect, FIGS. 3B-3D illustrate embodiments of electronic device package precursors, which each include housings 132a, 132b disposed about at least a lateral side and a top side of the contacts 131a, 131b such that the contacts are covered or inaccessible. Each of these electronic device package precursors can be subjected to further processing as described above to create an electronic device package in accordance with the present disclosure.

Figure 4:
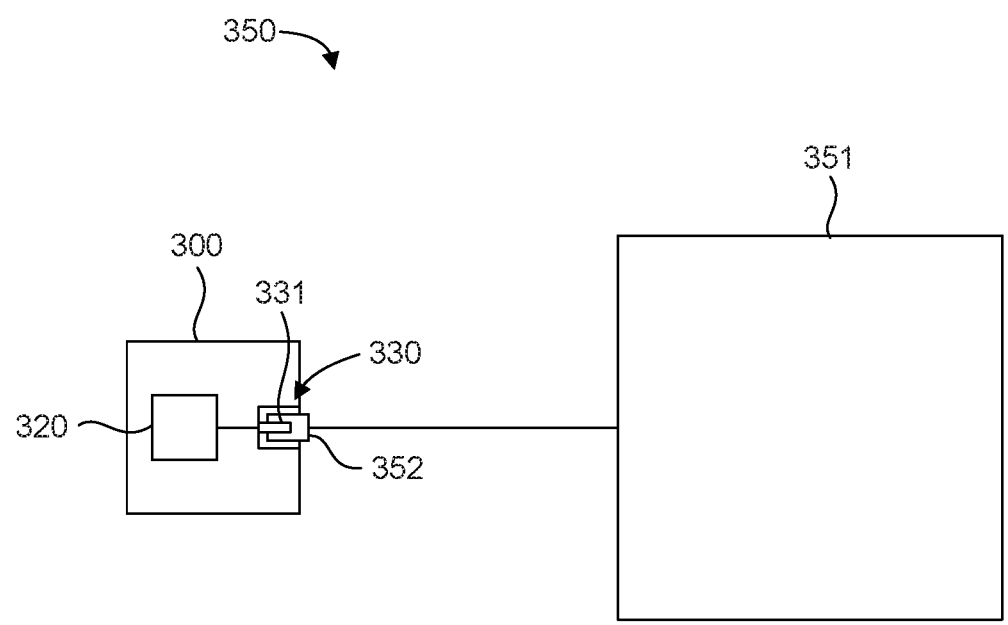
FIG. 4 is a schematic illustration of an exemplary electronic component testing system.

FIG. 4 schematically illustrates an example electronic component testing system 350. The testing system 350 can include an electronic device package 300 as disclosed herein, and a testing device 351 operably coupled to a connector 330 of the electronic device package via a mating connector 352 to provide a signal and/or power to a contact 331 of the connector 330 to test an electronic component 320 of the package 300. The testing device 350 can be any suitable type of testing device. In some embodiments, the testing device 350 can comprise a computer. In contrast to a typical testing adapter (e.g., an interposer, a test socket, etc.), the package 300 includes an active electronic component 320 (i.e., a die). Testing can be done at the component (e.g., unit), wafer, or panel level depending on the package manufacturing process. For example, a package can be manufactured in a variety of ways, such as at a legacy substrate strip level, wafer level, or panel level. In some embodiments, when a package is manufactured through a wafer or panel level packaging process, a batch test (e.g., test hundreds of packages at once) can be done at the wafer or panel level before the packages have been singulated into individual units. In another embodiment, the package 300 can be a unit similar in structure to the packages 100 or 200 shown in FIGS. 1 and 2, respectively, and can be tested as an individual unit or component that is physically distinct from other packages.

Figure 5:
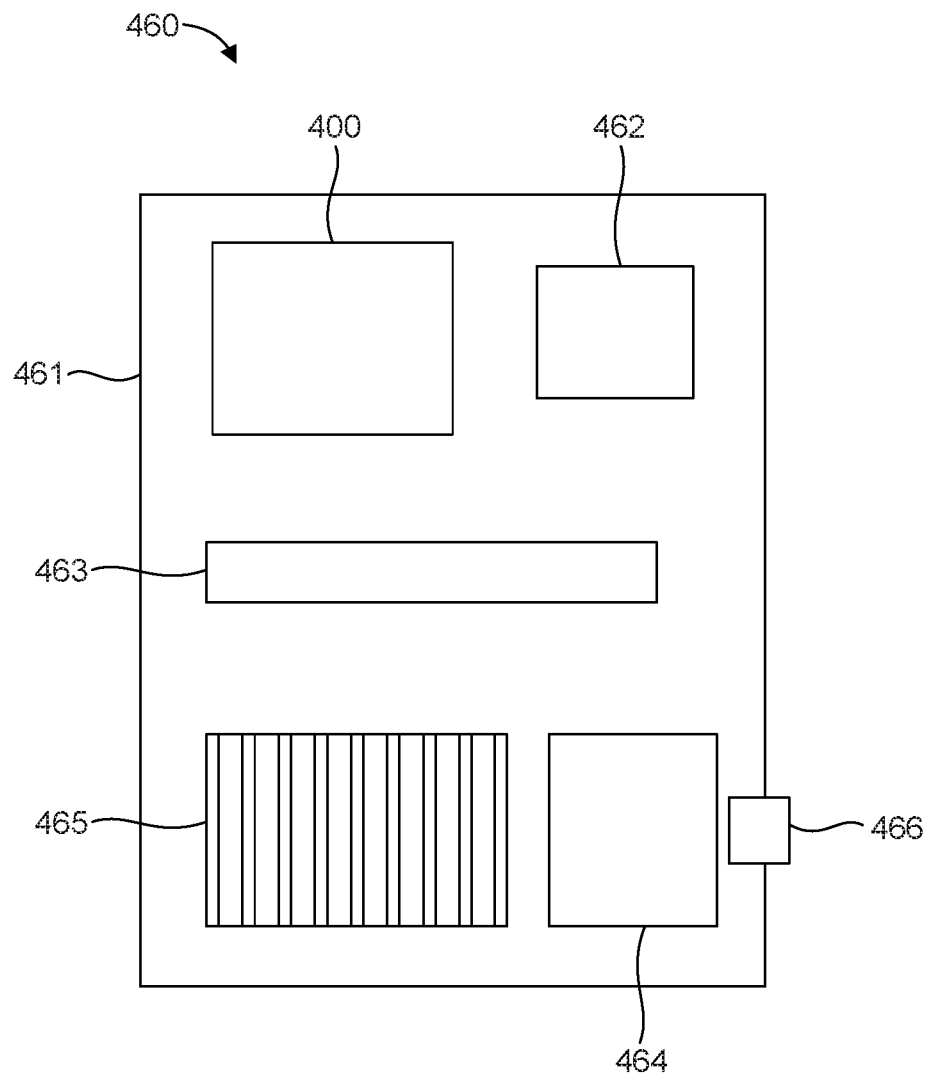
FIG. 5 is a schematic illustration of an exemplary computing system.

FIG. 5 schematically illustrates an example computing system 460. The computing system 460 can include an electronic device package 400 as disclosed herein, operably coupled to a motherboard 461. In one aspect, the computing system 460 can also include a processor 462, a memory device 463, a radio 464, a cooling system (e.g., a heat sink and/or a heat spreader) 465, a port 466, a slot, or any other suitable device or component, which can be operably coupled to the motherboard 461. The computing system 460 can comprise any type of computing system, such as a desktop computer, a laptop computer, a tablet computer, a smartphone, a server, a wearable electronic device, etc. Other embodiments need not include all of the features specified in FIG. 5, and may include alternative features not specified in FIG. 5.

EXAMPLES

The following examples pertain to further embodiments.

In one example there is provided, an electronic device package comprising a substrate, an electronic component disposed on the substrate and electrically coupled to the substrate, a connector disposed on the substrate and electrically coupled to the substrate for communication with the electronic component, the connector having a contact to interface with a mating connector and configured to provide at least one of a signal and power to the electronic component to facilitate testing the electronic component, and an encapsulant material disposed on the substrate and at least partially encapsulating at least one of the electronic component and the connector, wherein the contact is accessible on a top side of the electronic device package to facilitate coupling the connector to a testing device.

In one example of an electronic device package, the connector is positioned laterally relative to the electronic component.

In one example of an electronic device package, the connector is proximate a lateral side of the electronic device package.

In one example of an electronic device package, the connector is surface mounted to the substrate.

In one example of an electronic device package, the connector is through-hole mounted to the substrate.

In one example of an electronic device package, the contact comprises a protrusion, a receptacle, a pad, or a combination thereof.

In one example of an electronic device package, the connector comprises a housing disposed about at least a lateral side of the contact.

In one example of an electronic device package, the housing forms a socket in the encapsulant material and the contact is disposed at least partially in the socket.

In one example of an electronic device package, the encapsulant material is disposed between a portion of the housing and the substrate.

In one example of an electronic device package, the encapsulant material is continuous between the electronic component and the connector.

In one example of an electronic device package, the encapsulant material is disposed on all lateral sides of the connector.

In one example of an electronic device package, the encapsulant material comprises a mold compound material.

In one example of an electronic device package, the mold compound material comprises an epoxy.

In one example of an electronic device package, the substrate comprises a redistribution layer.

In one example of an electronic device package, the electronic component comprises a plurality of electronic components.

In one example of an electronic device package, the electronic component comprises an integrated circuit.

In one example of an electronic device package, the integrated circuit comprises an application specific integrated circuit, computer memory, or a combination thereof.

In one example, an electronic device package comprises interconnect structures coupled to a bottom side of the substrate to facilitate electrically coupling the electronic device package with an external electronic component.

In one example of an electronic device package, the interconnect structures comprise solder balls.

In one example there is provided, an electronic device package precursor comprising a substrate, and a connector disposed on the substrate and electrically coupled to the substrate, the connector having a contact to interface with a mating connector, and a housing disposed about at least a lateral side and a top side of the contact such that the contact is inaccessible.

In one example, an electronic device package precursor comprises an electronic component disposed on the substrate and electrically coupled to the substrate and the connector, wherein the contact is configured to provide at least one of a signal and power to the electronic component to facilitate testing the electronic component.

In one example, an electronic device package precursor comprises an encapsulant material disposed on the substrate and at least partially encapsulating at least one of the electronic component and the connector, wherein the encapsulant material is disposed adjacent the housing about the lateral side of the contact.

In one example of an electronic device package precursor, the encapsulant material is disposed adjacent the housing about the top side of the contact.

In one example of an electronic device package precursor, the connector is positioned laterally relative to the electronic component.

In one example of an electronic device package precursor, the connector is proximate a lateral side of the substrate.

In one example of an electronic device package precursor, the connector is surface mounted to the substrate.

In one example of an electronic device package precursor, the connector is through-hole mounted to the substrate.

In one example of an electronic device package precursor, the contact comprises a protrusion, a receptacle, a pad, or a combination thereof.

In one example of an electronic device package precursor, the housing forms a socket in the encapsulant material and the contact is disposed at least partially in the socket.

In one example of an electronic device package precursor, the encapsulant material is disposed between a portion of the housing and the substrate.

In one example of an electronic device package precursor, the encapsulant material is continuous between the electronic component and the connector.

In one example of an electronic device package precursor, the encapsulant material is disposed on all lateral sides of the connector.

In one example of an electronic device package precursor, the encapsulant material comprises a mold compound material.

In one example of an electronic device package precursor, the mold compound material comprises an epoxy.

In one example of an electronic device package precursor, the substrate comprises a redistribution layer.

In one example of an electronic device package precursor, the electronic component comprises a plurality of electronic components.

In one example of an electronic device package precursor, the electronic component comprises an integrated circuit.

In one example of an electronic device package precursor, the integrated circuit comprises an application specific integrated circuit, computer memory, or a combination thereof.

In one example, an electronic device package precursor comprises interconnect structures coupled to a bottom side of the substrate to facilitate electrically coupling with an external electronic component.

In one example of an electronic device package precursor, the interconnect structures comprise solder balls.

In one example, there is provided an electronic component testing system comprising an electronic device package and a testing device, the electronic device package comprising a substrate, an electronic component disposed on the substrate and electrically coupled to the substrate, a connector disposed on the substrate and electrically coupled to the substrate for communication with the electronic component, the connector having a contact to interface with a mating connector and configured to provide at least one of a signal and power to the electronic component to facilitate testing the electronic component, and an encapsulant material disposed on the substrate and at least partially encapsulating at least one of the electronic component and the connector, wherein the contact is accessible on a top side of the electronic device package to facilitate coupling the connector to the testing device, the testing device being operably coupled to the connector of the electronic device package to provide at least one of a signal and power to the contact to test the electronic component.

In one example of an electronic component testing system, the testing device comprises a computer.

In one example, there is provided a computing system comprising a motherboard and an electronic device package operably coupled to the motherboard, the electronic device package comprising a substrate, an electronic component disposed on the substrate and electrically coupled to the substrate, a connector disposed on the substrate and electrically coupled to the substrate for communication with the electronic component, the connector having a contact to interface with a mating connector and configured to provide at least one of a signal and power to the electronic component to facilitate testing the electronic component, and an encapsulant material disposed on the substrate and at least partially encapsulating at least one of the electronic component and the connector, wherein the contact is accessible on a top side of the electronic device package to facilitate coupling the connector to a testing device.

In one example of a computing system, the computing system comprises a desktop computer, a laptop, a tablet, a smartphone, a server, a wearable electronic device, or a combination thereof.

In one example of a computing system, the computing system further comprises a processor, a memory device, a cooling system, a radio, a slot, a port, or a combination thereof operably coupled to the motherboard.

In one example, there is provided a method for making an electronic device package comprising obtaining a substrate and disposing a connector on the substrate such that the connector is electrically coupled to the substrate, the connector having a contact to interface with a mating connector, and a housing disposed about at least a lateral side and a top side of the contact such that the contact is inaccessible.

In one example, a method for making an electronic device package comprises disposing an electronic component on the substrate such that the electronic component is electrically coupled to the substrate and the connector, wherein the contact is configured to provide at least one of a signal and power to the electronic component to facilitate testing the electronic component.

In one example, a method for making an electronic device package comprises disposing an encapsulant material on the substrate and at least partially encapsulating at least one of the electronic component and the connector, wherein the encapsulant material is disposed adjacent the housing about the lateral side of the contact.

In one example of a method for making an electronic device package, the encapsulant material is disposed adjacent the housing about the top side of the contact.

In one example of a method for making an electronic device package, the connector is positioned laterally relative to the electronic component.

In one example of a method for making an electronic device package, the connector is proximate a lateral side of the substrate.

In one example of a method for making an electronic device package, disposing a connector on the substrate comprises surface mounting the connector to the substrate.

In one example of a method for making an electronic device package, disposing a connector on the substrate comprises through-hole mounting the connector to the substrate.

In one example of a method for making an electronic device package, the contact comprises a protrusion, a receptacle, a pad, or a combination thereof.

In one example of a method for making an electronic device package, the housing forms a socket in the encapsulant material and the contact is disposed at least partially in the socket.

In one example of a method for making an electronic device package, the encapsulant material is disposed between a portion of the housing and the substrate.

In one example of a method for making an electronic device package, the encapsulant material is continuous between the electronic component and the connector.

In one example of a method for making an electronic device package, the encapsulant material is disposed on all lateral sides of the connector.

In one example of a method for making an electronic device package, the encapsulant material comprises a mold compound material.

In one example of a method for making an electronic device package, the mold compound material comprises an epoxy.

In one example, a method for making an electronic device package comprises exposing the contact such that the contact is accessible on a top side of the electronic device package to facilitate coupling the connector to a testing device.

In one example of a method for making an electronic device package, exposing the contact comprises removing a portion of the housing from a top side of the connector.

In one example of a method for making an electronic device package, removing the portion of the housing comprises grinding, polishing, cutting, machining, or a combination thereof.

In one example, a method for making an electronic device package comprises exposing the contact such that the contact is accessible on a top side of the electronic device package to facilitate coupling the connector to a testing device.

In one example of a method for making an electronic device package, exposing the contact comprises removing encapsulant material from a top side of the connector.

In one example of a method for making an electronic device package, removing encapsulant material comprises grinding, polishing, cutting, machining, or a combination thereof.

In one example of a method for making an electronic device package, exposing the contact comprises removing a portion of the housing from a top side of the connector.

In one example of a method for making an electronic device package, removing the portion of the housing comprises grinding, polishing, cutting, machining, or a combination thereof.

In one example of a method for making an electronic device package, the substrate comprises a redistribution layer.

In one example of a method for making an electronic device package, the electronic component comprises a plurality of electronic components.

In one example of a method for making an electronic device package, the electronic component comprises an integrated circuit.

In one example of a method for making an electronic device package, the integrated circuit comprises an application specific integrated circuit, computer memory, or a combination thereof.

In one example, a method for making an electronic device package comprises coupling interconnect structures to a bottom side of the substrate to facilitate electrically coupling with an external electronic component.

In one example of a method for making an electronic device package, the interconnect structures comprise solder balls.

Circuitry used in electronic components or devices (e.g. a die) of an electronic device package can include hardware, firmware, program code, executable code, computer instructions, and/or software. Electronic components and devices can include a non-transitory computer readable storage medium which can be a computer readable storage medium that does not include signal. In the case of program code execution on programmable computers, the computing devices recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:

1. An electronic device package, comprising:
   a substrate;
   at least one electronic component disposed on the substrate and electrically coupled to the substrate;
   a connector disposed on the substrate and electrically coupled to the substrate for communication with the electronic component, the connector having
      a contact to interface with a mating connector and configured to provide at least one of a signal and power to the electronic component to facilitate testing the electronic component, and
      a housing disposed about at least a lateral side of the contact; and
   an encapsulant material disposed on the substrate and at least partially encapsulating at least one of the electronic component and the connector, wherein the encapsulant material interfaces with a lateral side of the housing, and the contact is accessible on a top side of the electronic device package to facilitate coupling the connector to a testing device.

2. The electronic device package of claim 1, wherein the connector is positioned laterally relative to the electronic component.

3. The electronic device package of claim 1, wherein the connector is adjacent to a lateral side of the electronic device package.

4. The electronic device package of claim 1, wherein the connector is surface mounted to the substrate.

5. The electronic device package of claim 1, wherein the connector is through-hole mounted to the substrate.

6. The electronic device package of claim 1, wherein the contact comprises a protrusion, a receptacle, a pad, or a combination thereof.

7. The electronic device package of claim 1, wherein the encapsulant material is continuous between the electronic component and the connector.

8. The electronic device package of claim 1, wherein the encapsulant material is disposed on all lateral sides of the connector.

9. The electronic device package of claim 1, wherein the encapsulant material comprises a mold compound material.

10. The electronic device package of claim 1, wherein the substrate comprises a redistribution layer.

11. The electronic device package of claim 1, wherein the at least one electronic component comprises a plurality of electronic components.

12. The electronic device package of claim 1, wherein the electronic component comprises an integrated circuit.

13. The electronic device package of claim 1, further comprising interconnect structures coupled to a bottom side of the substrate to facilitate electrically coupling the electronic device package with an external electronic component.

14. The electronic device package of claim 13, wherein the interconnect structures comprise solder balls.

15. A method for making an electronic device package, comprising:
  obtaining a substrate;
  disposing a connector on the substrate such that the connector is electrically coupled to the substrate, the connector having a contact to interface with a mating connector, and a housing disposed about at least a lateral side and a top side of the contact such that the contact is inaccessible; and
  disposing an encapsulant material on the substrate and at least partially encapsulating the connector, wherein the encapsulant material interfaces with a lateral side of the housing, and the encapsulant material is disposed adjacent the housing about the lateral side of the contact.

16. The method of claim 15, further comprising disposing an electronic component on the substrate such that the electronic component is electrically coupled to the substrate and the connector, wherein the contact is configured to provide at least one of a signal and power to the electronic component to facilitate testing the electronic component.

17. The method of claim 15, wherein the connector is adjacent to a lateral side of the substrate.

18. The method of claim 15, wherein disposing a connector on the substrate comprises surface mounting the connector to the substrate.

19. The method of claim 15, wherein disposing a connector on the substrate comprises through-hole mounting the connector to the substrate.

20. The method of claim 15, wherein the contact comprises a protrusion, a receptacle, a pad, or a combination thereof.

21. The electronic device package of claim 1, wherein a material of the housing is different than the encapsulant material.

* * * * *